(12) United States Patent
Yu et al.

(10) Patent No.: US 12,368,112 B2
(45) Date of Patent: Jul. 22, 2025

(54) ELECTRONIC COMPONENT AND MANUFACTURING METHOD THEREOF

(71) Applicant: Taiwan Semiconductor Manufacturing Company, Ltd., Hsinchu (TW)

(72) Inventors: Chi-Yang Yu, Taoyuan (TW); Jung-Wei Cheng, Hsinchu (TW); Yu-Min Liang, Taoyuan (TW); Chien-Hsun Lee, Hsin-chu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 498 days.

(21) Appl. No.: 17/901,784

(22) Filed: Sep. 1, 2022

(65) Prior Publication Data
US 2024/0079346 A1   Mar. 7, 2024

(51) Int. Cl.
*H01L 23/00* (2006.01)
*H01L 23/498* (2006.01)
*H01L 25/16* (2023.01)

(52) U.S. Cl.
CPC ...... *H01L 23/562* (2013.01); *H01L 23/49838* (2013.01); *H01L 23/49894* (2013.01); *H01L 24/16* (2013.01); *H01L 24/32* (2013.01); *H01L 24/73* (2013.01); *H01L 25/165* (2013.01); *H01L 23/49816* (2013.01); *H01L 2224/16227* (2013.01); *H01L 2224/16238* (2013.01); *H01L 2224/32225* (2013.01); *H01L 2224/73204* (2013.01); *H01L 2224/73253* (2013.01); *H01L 2924/1616* (2013.01); *H01L 2924/16235* (2013.01); *H01L 2924/16251* (2013.01); *H01L 2924/1632* (2013.01); *H01L 2924/3511* (2013.01); *H01L 2924/37001* (2013.01)

(58) Field of Classification Search
CPC ............ H01L 23/562; H01L 23/49838; H01L 23/49894; H01L 23/49816; H01L 24/16; H01L 24/32; H01L 24/73; H01L 25/165; H01L 2224/16227; H01L 2224/16238; H01L 2224/32225; H01L 2224/73204; H01L 2224/73253; H01L 2924/1616; H01L 2924/16235; H01L 2924/16251; H01L 2924/1632; H01L 2924/3511; H01L 2924/37001
See application file for complete search history.

(56) References Cited

U.S. PATENT DOCUMENTS

| | | | |
|---|---|---|---|
| 2008/0308305 A1* | 12/2008 | Kawabe | H05K 1/0271 174/255 |
| 2010/0078786 A1* | 4/2010 | Maeda | H01L 23/3128 257/E23.18 |
| 2015/0187679 A1* | 7/2015 | Ho | H01L 23/055 438/118 |

(Continued)

*Primary Examiner* — Peniel M Gumedzoe
(74) *Attorney, Agent, or Firm* — JCIPRNET

(57) ABSTRACT

An electronic component includes a board, an electronic device, and a stiffening structure is provided. The electronic device is disposed on the board. The stiffening structure is disposed on the board. The stiffening structure includes a ring portion corresponding the edge of the board. The stiffening structure includes a core base and a cladding layer. The cladding layer covers the core base.

20 Claims, 6 Drawing Sheets

(56) References Cited

U.S. PATENT DOCUMENTS

2018/0149965 A1\* 5/2018 Iizuka ..................... C22C 1/00
2021/0265251 A1\* 8/2021 Mun .................. H01L 23/3128
2021/0378106 A1\* 12/2021 Iyengar ................ H01L 23/562

\* cited by examiner

ELECTRONIC COMPONENT AND MANUFACTURING METHOD THEREOF

BACKGROUND

A corresponding heating step may be performed in the manufacturing method of an electronic component. However, due to the different coefficient of thermal expansion (CTE) of the materials, warpage of the object may be caused during or after the heating step. Therefore, the quality or manufacturing yield of the electronic component may be affected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
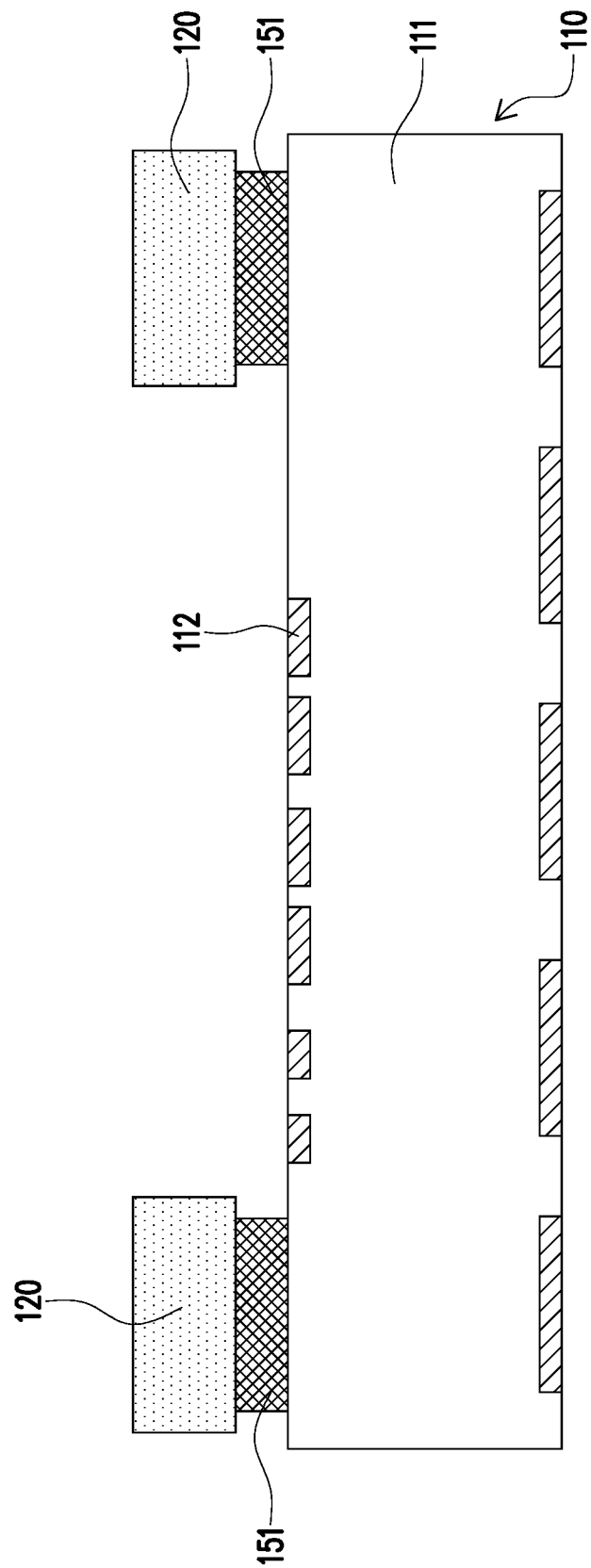
FIG. 1A to FIG. 1B are schematic cross-sectional views illustrating a manufacturing process of an electronic component in accordance with an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
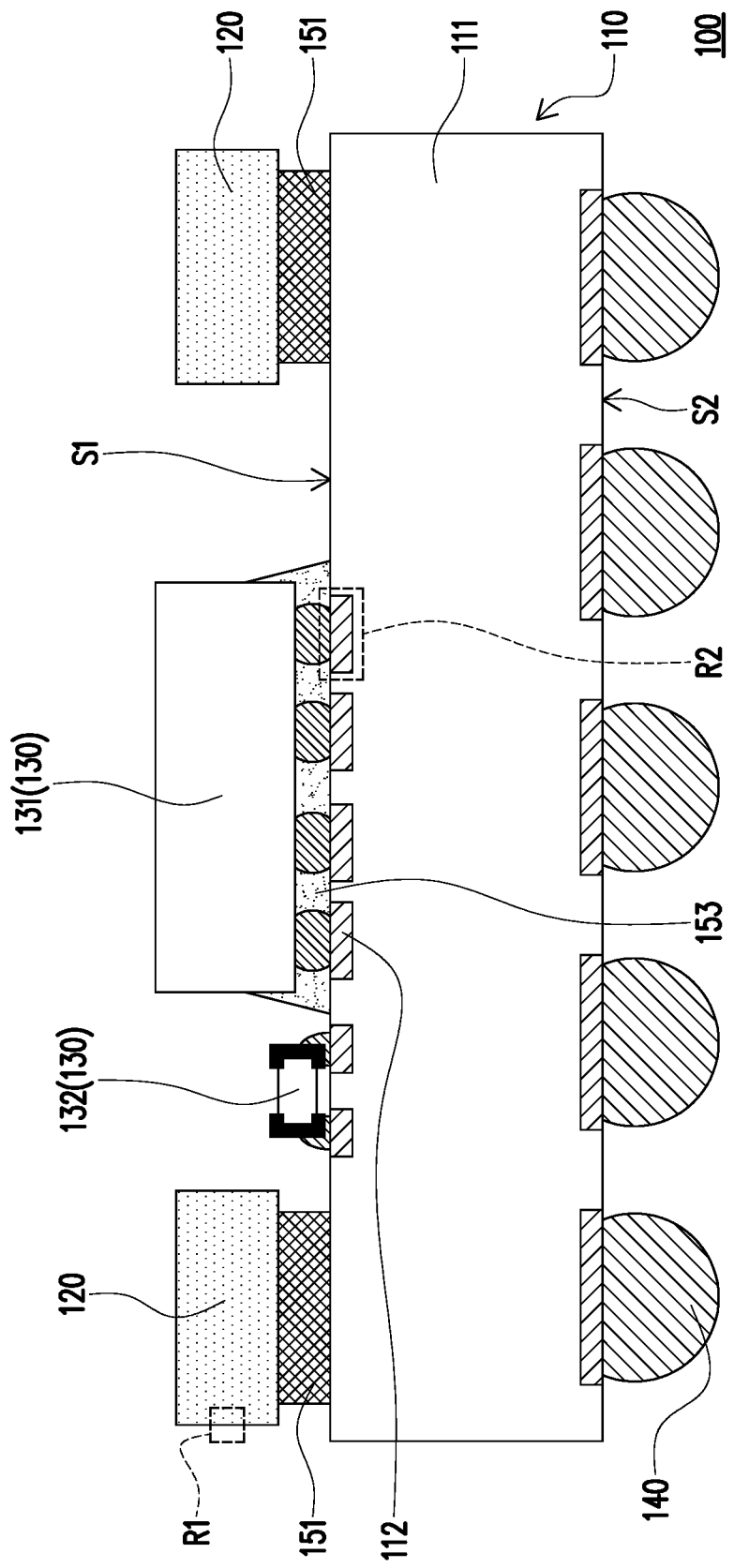
Figure 1C:
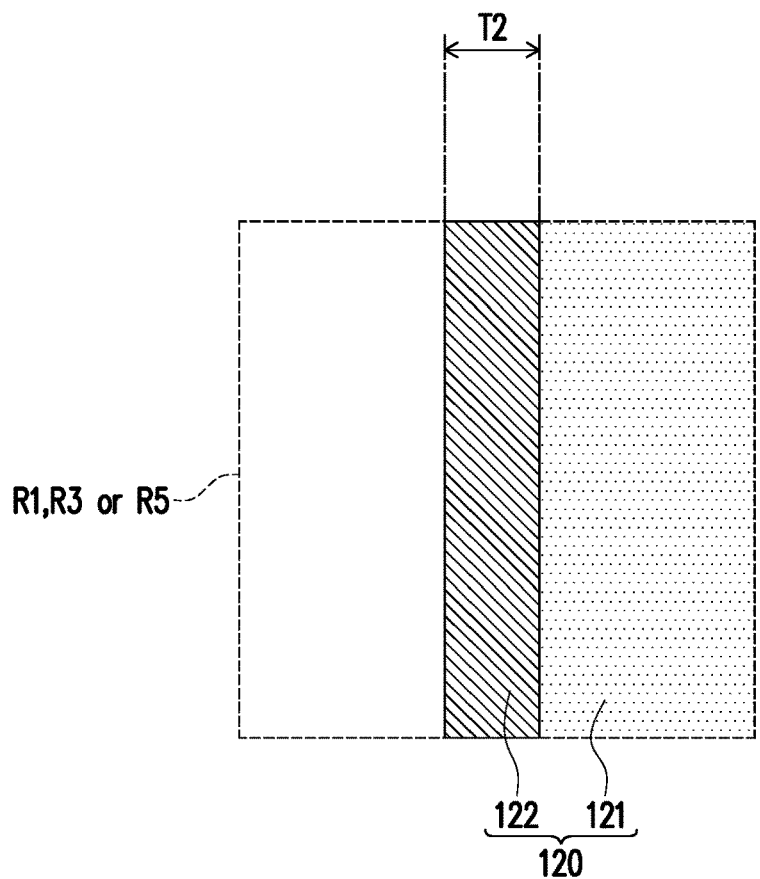
FIG. 1C is a portion of schematic cross-sectional view illustrating an electronic component in accordance with an embodiment of the disclosure.
Figure 1D:
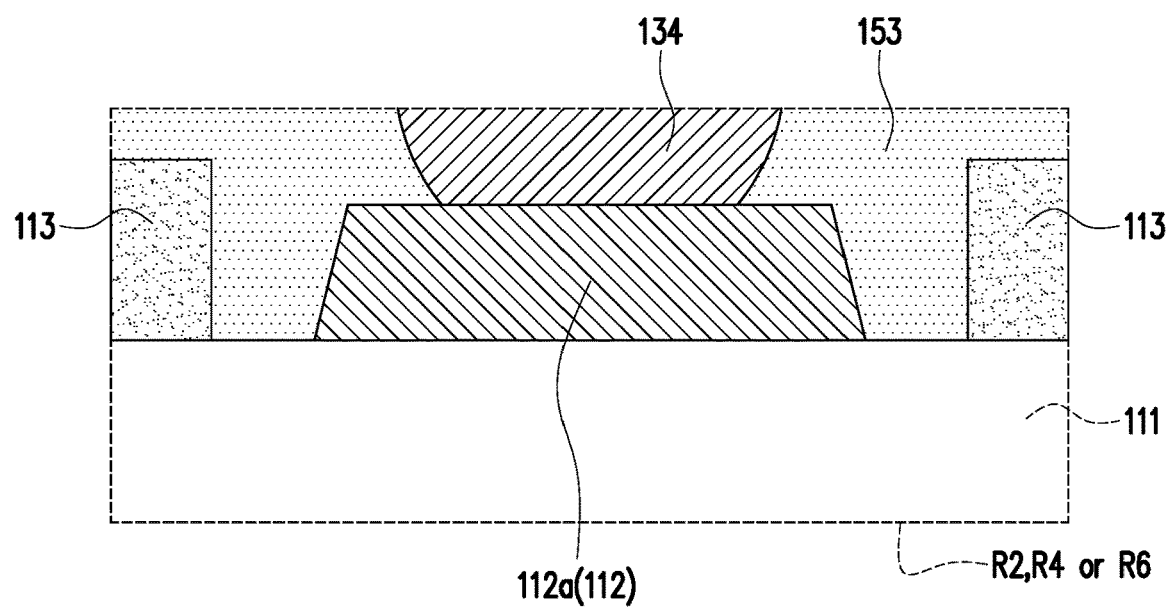
FIG. 1D is a portion of schematic cross-sectional view illustrating an electronic component in accordance with an embodiment of the disclosure.
Figure 1E:
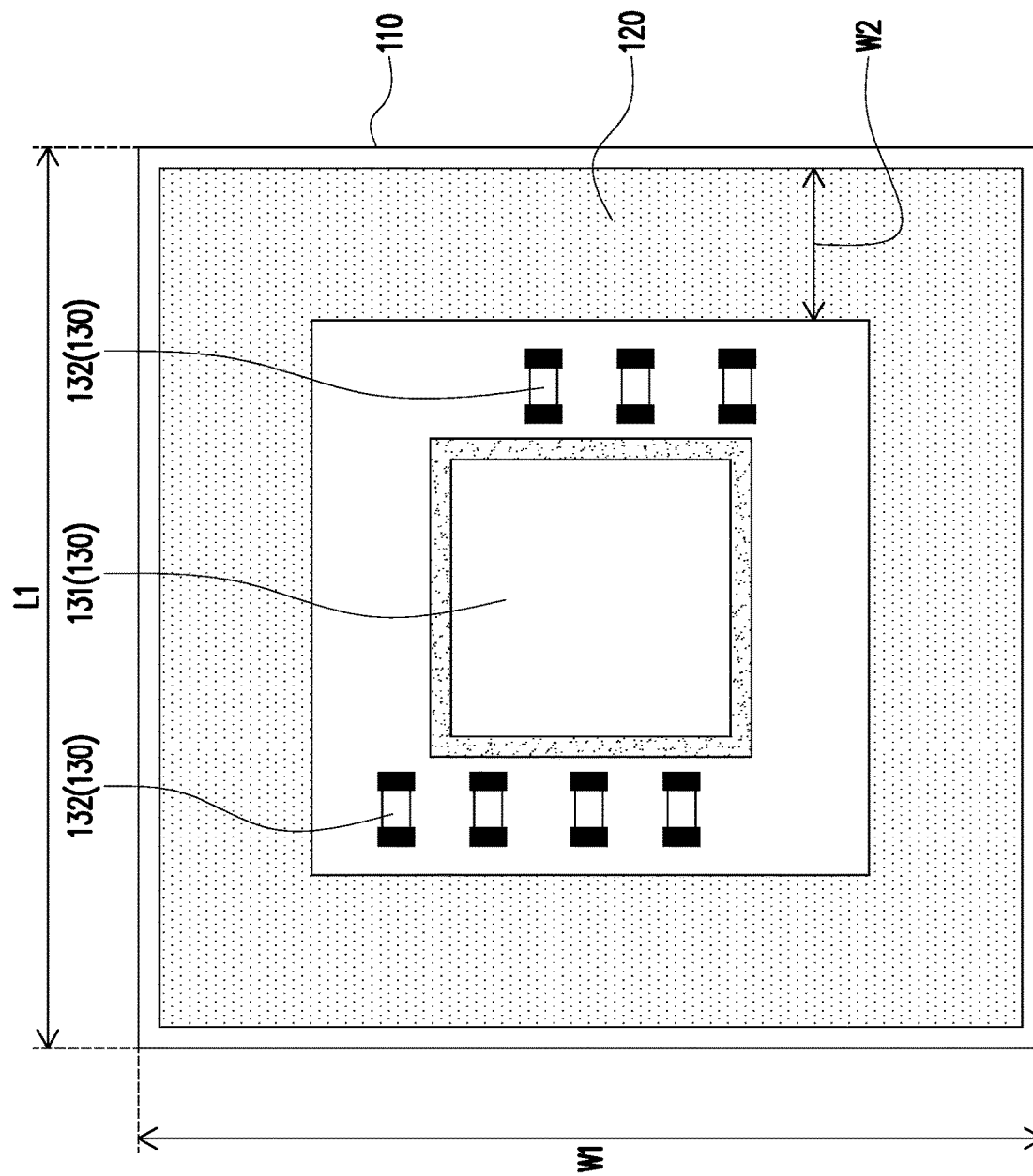
FIG. 1E is a top view illustrating an electronic component in accordance with an embodiment of the disclosure.

FIG. 1A to FIG. 1B are schematic cross-sectional views illustrating a manufacturing process of an electronic component in accordance with an embodiment of the disclosure. FIG. 1C is a portion of schematic cross-sectional view illustrating an electronic component in accordance with an embodiment of the disclosure. For example, FIG. 1C may correspond to the R1 region as shown in FIG. 1B. FIG. 1D is a portion of schematic cross-sectional view illustrating an electronic component in accordance with an embodiment of the disclosure. For example, FIG. 1D may correspond to the R2 region as shown in FIG. 1B. FIG. 1E is a top view illustrating an electronic component in accordance with an embodiment of the disclosure.

Referring to FIG. 1, a circuit board 110 is provided. The circuit board 110 may include a core body 111 and a circuit layer 112 disposed thereon.

The material of the core body 111 may include glass fiber, plastic (e.g., epoxy resin, acrylic resin, or a combination thereof, but the disclosure is not limited thereto), or a combination or lamination thereof. For example, the core body 111 may be referred as a FR4 board or a FR5 board.

In view of conductivity, the circuit layer 112 may be made of a metallic material, such as copper, copper alloys, or copper-containing metal stacks. The layout or pattern of the circuit layer 112 may be adjusted according to design requirements, which are not limited in the disclosure.

A portion of the circuit layer 112 may be referred as a bonding pad 112a. For example, the circuit board 110 may further include a solder mask layer 113 disposed on the core body 111. The solder mask layer 113 may expose a portion of the circuit layer 112 and cover another portion of the circuit layer 112. A portion of the circuit layer 112 exposed by the solder mask layer 113 may be suitable for bonding with a conductive member (e.g., a solder), and may be referred as a bonding pad 112a.

In an embodiment, the circuit board 110 may be referred as a printed circuit board (PCB). For example, the circuit board 110 may be referred as a double-sided PCB. A conductive through via (not shown in the figure) may be used to electrically connect the corresponding circuits on different sides.

Still referring to FIG. 1, a stiffening structure 120 may be fixed directly or indirectly on a surface of the circuit board 110.

For example, as shown in FIG. 1, two ends of the adhesive layer 151 may respectively contact the organic material (e.g., solder mask layer 113) of the circuit board 110 and the stiffening structure 120. A material of the adhesive layer 151 may include epoxy, polyimide, or the like. As such, the bonding force between the stiffening structure 120 and the circuit board 110 may be improved.

In an embodiment not shown, the stiffening structure 120 may be snapped on the circuit board 110. For example, the stiffening structure 120 may have a corresponding tenon, and the circuit board 110 may have a corresponding slot.

Figure 3:
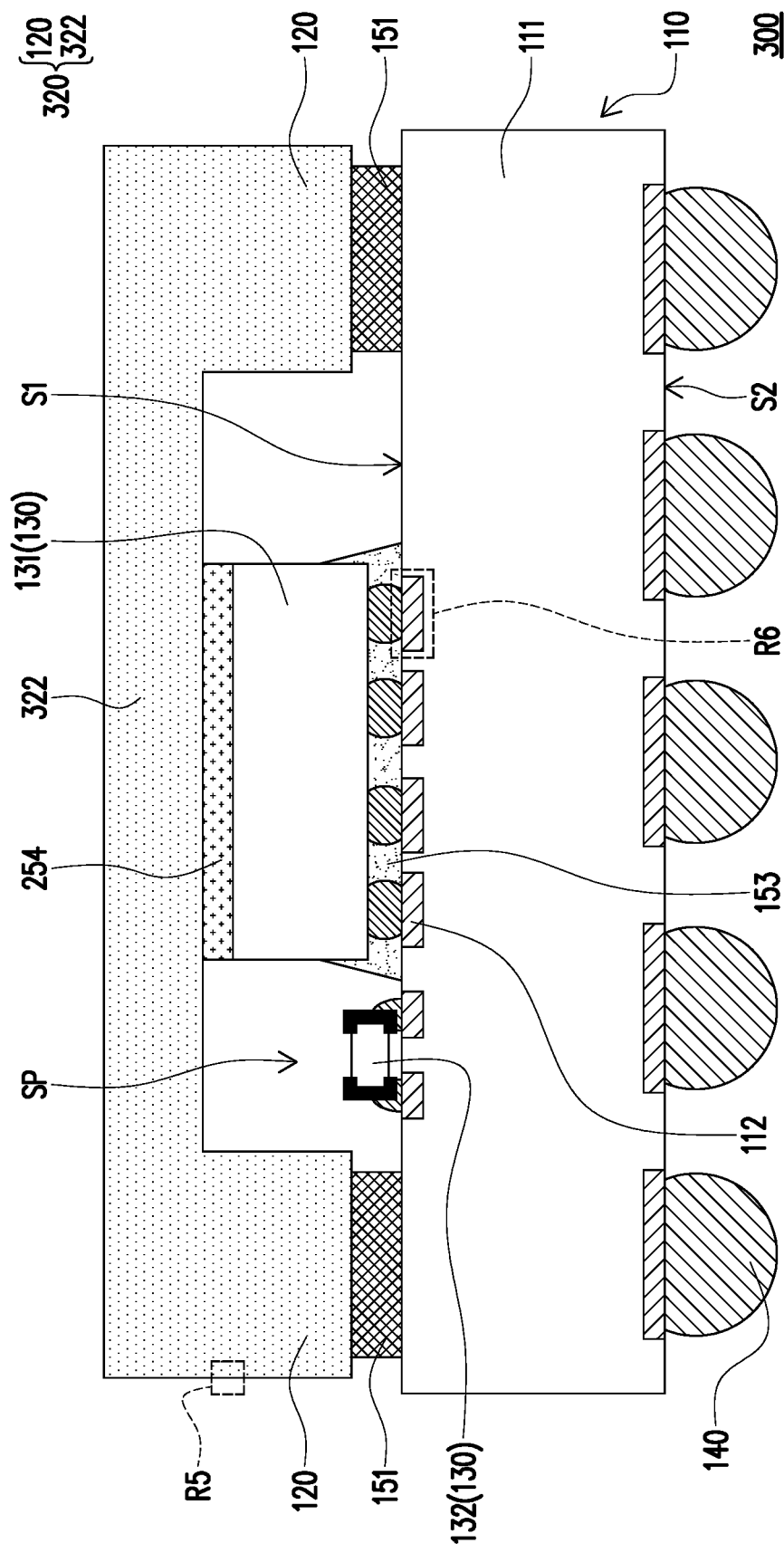
FIG. 3 is a schematic cross-sectional view illustrating an electronic component in accordance with an embodiment of the disclosure.

Taking FIG. 3 as an example, the stiffening structure 120 includes a ring portion corresponding the edge of the circuit board 110. That is, the stiffening structure 120 may be referred as a ring structure. From a top view (e.g., the view as shown in FIG. 3), the stiffening structure 120 may be a rectangular ring, but the disclosure is not limited thereto.

In an embodiment, the coefficient of thermal expansion of the stiffening structure 120 is about 80% to 120% of the coefficient of thermal expansion of the circuit board 110. For example, the thermal expansion coefficient of the stiffening structure 120 is about 6 ppm/K to 19 ppm/K.

In an embodiment, the thermal expansion coefficient of the stiffening structure 120 is about 6 ppm/K to 19 ppm/K, and the thermal expansion coefficient of the circuit board 110 is about 7 ppm/K to 20 ppm/K.

In an embodiment, the Young's modulus of the stiffening structure 120 is lower than about 20 GPa. For example, the Young's modulus of the stiffening structure 120 is about 10 GPa to 19 GPa.

In an embodiment, in a direction parallel to a surface of the circuit board 110, a width of the ring portion of the stiffening structure 120 is at least approximately 5% of the size of the circuit board 110.

In an embodiment, as shown in FIG. 3, the width W2 of the ring portion of the stiffening structure 120 is about 2.5 (±10%) millimeter (mm), and the specification (e.g., length L1×width W1) of the circuit board 110 may about 14 mm×16 mm, 18 mm×21 mm, or 23 mm×27 mm.

In an embodiment, the coefficient of thermal expansion (CTE) of the stiffening structure 120 is the same or similar to the coefficient of thermal expansion of the circuit board 110, the Young's modulus of the stiffening structure 120 may be lower than the Young's modulus of the circuit board 110, and in a direction parallel to the surface, the width of the ring portion of the stiffening structure 120 is at least 5% of the size of the circuit board 110. As such, in a subsequent heating process, the warpage of the circuit board 110 may be reduced.

In an embodiment, the stiffening structure 120 includes a core base 121 and a cladding layer 122. The cladding layer 122 covers the core base 121.

In an embodiment, a material of the core base 121 may include or be an aluminum-silicon alloy (Al—Si alloy). Sometime, an Al—Si alloy may be referred to as silumin.

In an embodiment, a weight ratio of Al and Si in the Al—Si alloy as the stiffening structure 120 may be about 20:80 to 80:20. A coefficient of thermal expansion of an Al—Si alloy with a weight ratio of Al to Si of 20:80 is about 6 ppm/K. A coefficient of thermal expansion of an Al—Si alloy with a weight ratio of Al to Si of 25:75 is about 6 ppm/K. A coefficient of thermal expansion of an Al—Si alloy with a weight ratio of Al to Si of 30:70 is about 7 ppm/K. A coefficient of thermal expansion of an Al—Si alloy with a weight ratio of Al to Si of 20:80 is about 8 ppm/K. A coefficient of thermal expansion of an Al—Si alloy with a weight ratio of Al to Si of 37:63 is about 9 ppm/K. A coefficient of thermal expansion of an Al—Si alloy with a weight ratio of Al to Si of 40:60 is about 10 ppm/K. A coefficient of thermal expansion of an Al—Si alloy with a weight ratio of Al to Si of 50:50 is about 11 ppm/K. A coefficient of thermal expansion of an Al—Si alloy with a weight ratio of Al to Si of 70:30 is about 13 ppm/K. A coefficient of thermal expansion of an Al—Si alloy with a weight ratio of Al to Si of 58:42 is about 14 ppm/K. A coefficient of thermal expansion of an Al—Si alloy with a weight ratio of Al to Si of 65:35 is about 15 ppm/K. A coefficient of thermal expansion of an Al—Si alloy with a weight ratio of Al to Si of 73:27 is about 17 ppm/K. A coefficient of thermal expansion of an Al—Si alloy with a weight ratio of Al to Si of 80:20 is about 19 ppm/K.

In an embodiment, the thickness T2 of the cladding layer 122 covering the core base 121 is about 1 micrometer (μm) to 20 μm. The cladding layer 122 may be formed by a plating process, which are not limited in the disclosure.

For improving the adhesion and/or chemical resistance, a material of the cladding layer 122 may include nickel (Ni), titanium (Ti), aluminum (Al), or other suitable metal element. For example, the cladding layer 122 may include a nickel layer, a titanium layer, an aluminum layer, or a combination or lamination thereof.

In an embodiment, a stiffening structure 120 may be formed by the following process. Add a silicon-containing raw material to molten aluminum; then, a die casting process or a pressure casting process is performed to form a plate-like or bulk-like Al—Si alloy material. In the above-mentioned die casting process or die casting process, a ring-shaped Al—Si alloy (e.g., the core base 121) may be directly formed; or, a removing process (e.g., a diamond wire cutting process or a drilling process) may be further performed to form a ring-shaped Al—Si alloy (e.g., the core base 121). Then, a plating process (e.g., an ultrasonic plating process) may be performed to form a layer (e.g., a portion of the cladding layer 122) on the ring-shaped Al—Si alloy (e.g., the core base 121).

In an embodiment, the above-mentioned drilling process may form a plate-like or bulk-like Al—Si alloy material into an appropriate shape (e.g., not limited to a ring shape).

In an embodiment, the interface formed between the core base 121 and the cladding layer 122 may be a rough surface.

In an embodiment, the roughness of the outer surface of the cladding layer 122 is smaller than the roughness of the interface between the cladding layer 122 and the core base 121. For example, a plating process (e.g., an ultrasonic plating process) may be performed to form a layer (e.g., a portion of the cladding layer 122) on the ring-shaped Al—Si alloy (e.g., the core base 121); then, another plating process (e.g., an electroplating plating process) may be performed to form another layer (e.g., another portion of the cladding layer 122) on the above-mentioned layer.

In an embodiment, the Al—Si alloy may contain a small amount of other element such as iron (Fe), copper (Cu), manganese (Mn), magnesium (Mg), titanium (Ti), strontium (Sr), zinc (Zn), nickel (Ni), tin (Sn), calcium (Ca), antimony (Sb), phosphorus (P), and/or lead (Pb). The weight percentage of one of the aforementioned other elements (e.g, a non-aluminum and non-silicon element) in the Al—Si alloy basically does not exceed 5 wt %. The total weight percentage of the aforementioned other elements (e.g, a non-aluminum and non-silicon element) in the Al—Si alloy basically does not exceed 8 wt %.

Referring to FIG. 1A to FIG. 1B, an electronic device 130 may be disposed on the surface of the circuit board 110. It should be noted that the number of the electronic device 130 disposed on the circuit board 110 does not limit in the disclosure.

For example, an active electronic device (e.g., a chip) 131 may be disposed on the surface S1 of the circuit board 110. The active electronic device 131 may be disposed via a flip chip process. The flip chip process may include a corresponding heating process (e.g., a reflow process for solder 134).

For example, a passive electronic device (e.g., a capacitor or a resistor) 132 may be bond on the surface S1 of the circuit board 110. The bonding process may include a corresponding heating process (e.g., a reflow process for solder).

In an embodiment, the electronic device 130 may be a Central Process Unit (CPU) dies, a Graphic Process Unit (GPU) dies, a Field-Programmable Gate Array (FPGA), a Dynamic Random Access Memory (DRAM), a Resistive Random Access Memory (RRAM), a Static Random Access Memory (SRAM), or the like, but the disclosure is not limited thereto.

In an embodiment, a underfill 153 may be disposed between the electronic device 130 and the circuit board 110. The underfill 153 does not directly contact to the stiffening structure 120 basically.

In an embodiment, for the process window of disposing the electronic device 130, in a direction parallel to a surface S1 of the circuit board 110, a distance between the electronic device 130 and the stiffening structure 120 is larger or approximately equal to 1 mm. In an embodiment, in the direction parallel to the surface S1 of the circuit board 110, a distance between the any electronic device (e.g., the electronic device 130 or the like) and the stiffening structure 120 is larger or approximately equal to 1 mm.

In an embodiment as shown in FIG. 1A to FIG. 1B, an electronic device 130 is disposed on the circuit board 110 after the stiffening structure 120 being disposed, but the disclosure is not limited thereto.

It is worth noting that the type of heating process performing after the stiffening structure 120 being disposed on the board is not limited in the disclosure.

In an embodiment, a conductive terminal (e.g., a solder ball) 140 may be bond on the surface S2 of the circuit board 110. The conductive terminal 140 may be bond on the surface of the circuit board 110 after the stiffening structure 120 and the electronic device 130 being disposed.

An electronic component 100 of an embodiment may be formed by the above manufacturing process. The electronic component 100 includes a circuit board 110, an electronic device 130, and a stiffening structure 120. The electronic device 130 is disposed on the circuit board 110. The stiffening structure 120 is disposed on the circuit board 110. The stiffening structure 120 includes a ring portion corresponding the edge of the circuit board 110.

In the manufacturing process of the electronic component 100, the stiffening structure 120 on the circuit board 110 may reduce the warpage of the circuit board 110 during a heating process. As such, the yield or quality of the electronic component 100s may be improved.

In an embodiment, the electronic component 100 may be used as a type of SoIS (System on Integrated Substrate) technology application, but the disclosure is not limited thereto.

Figure 2:
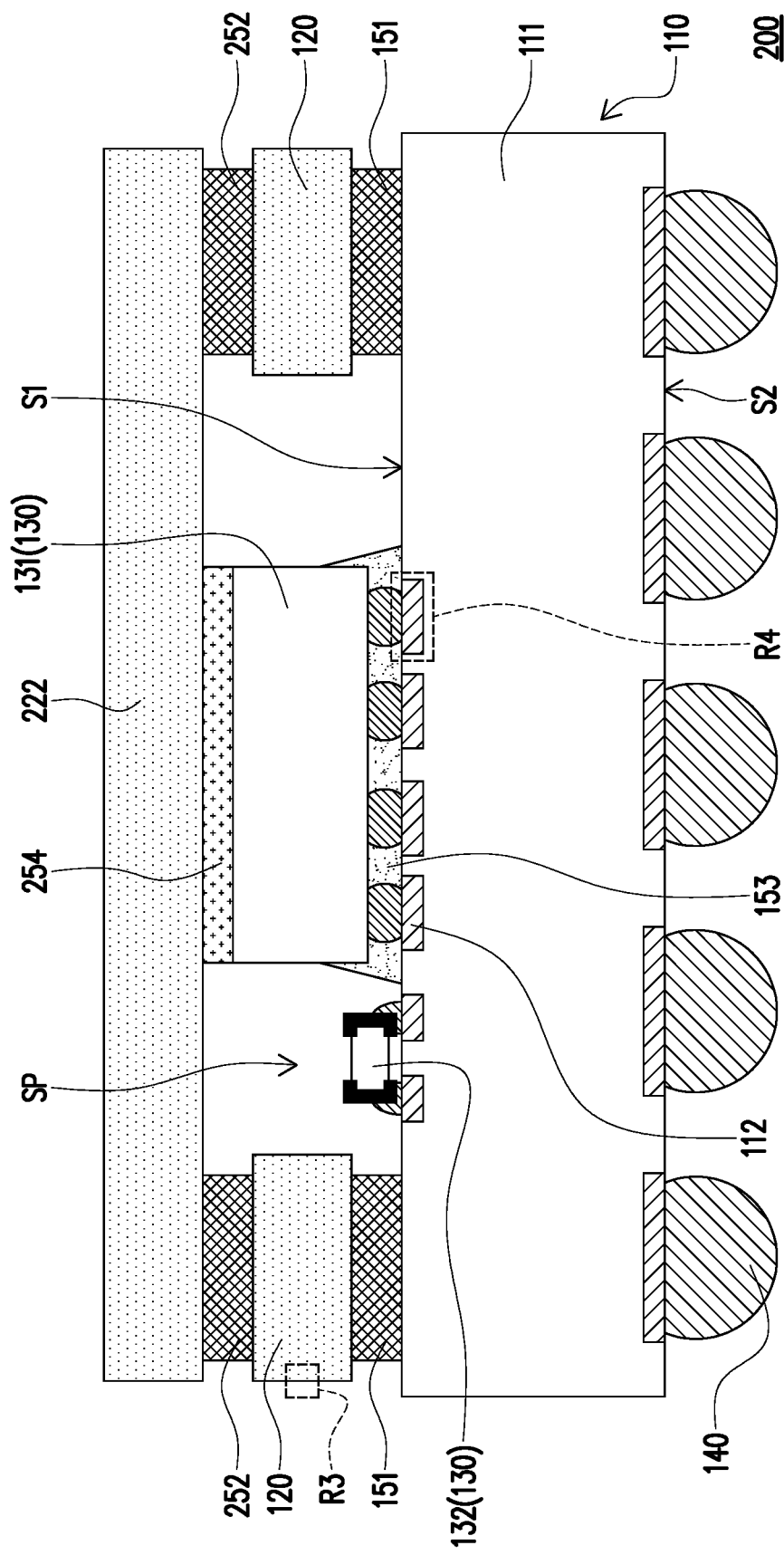
FIG. 2 is a schematic cross-sectional view illustrating an electronic component in accordance with an embodiment of the disclosure.

FIG. 2 is a schematic cross-sectional view illustrating an electronic component in accordance with an embodiment of the disclosure. The embodiment shown in FIG. 2 may be similar to the embodiment shown in FIG. 1B, therefore, the same reference numerals are used to refer to the same or like parts, and their detailed descriptions are omitted herein. For example, FIG. 1C may correspond to the R3 region as shown in FIG. 2, and/or FIG. 1D may correspond to the R4 region as shown in FIG. 2.

Referring to FIG. 2, the electronic component 200 includes a circuit board 110, an electronic device 130, and a stiffening structure 120, and a cover 222. The cover 222 is disposed on the stiffening structure 120. The electronic device 130 is disposed in a space S formed by the stiffening structure 120, the cover 222, and the circuit board 110.

In an embodiment, the cover 222 may be disposed on the stiffening structure 120 after the stiffening structure 120 and the electronic device 130 being disposed on the circuit board 110.

In an embodiment, a distance between the top of the electronic device 130 (e.g., the position where the electronic device 130 is farthest from the circuit board 110 in the thickness direction of the electronic component 200) and the circuit board 110 is greater than a distance between the top of the stiffening structure 120 (e.g., the position where the stiffening structure 120 is farthest from the circuit board 110 in the thickness direction of the electronic component 200) and the circuit board 110.

In an embodiment, the thickness of the electronic device 130 is greater than the thickness of the stiffening structure 120.

In an embodiment, there is no molding compound (e.g., epoxy resin, phenolic resin, or silicon resin) disposed on the surface S1 of the circuit board 110 where the electronic device 130 is disposed on. For example, there is no molding compound in the space S in direct contact with the electronic device 130, the circuit board 110, the stiffening structure 120, and the cover 222.

In an embodiment, a gas space may exist within the enclosed space (e.g., the space S) formed by the stiffening structure 120, the cover 222, and the circuit board 110.

In an embodiment, the structure of the cover 222 may be similar to the structure of the stiffening structure 120. For example, the cover 222 may include a core base (e.g., the same or similar to the core base 121 as shown in FIG. 1C) and a cladding layer (e.g., the same or similar to the cladding layer 122 as shown in FIG. 1C).

In an embodiment, an adhesive layer 252 is disposed between the stiffening structure 120 and the cover 222. A material of the adhesive layer 252 may include epoxy, polyimide, or the like.

In an embodiment, an adhesive layer 254 may be disposed between the electronic device 130 (e.g., the active electronic device 131) and the cover 222. The adhesive layer 254 may include a die attach film (DAF), a silver paste, or a thermally conductive film.

FIG. 3 is a schematic cross-sectional view illustrating an electronic component 100 in accordance with an embodiment of the disclosure. The embodiment shown in FIG. 3 may be similar to the embodiment shown in FIG. 1B, therefore, the same reference numerals are used to refer to the same or like parts, and their detailed descriptions are omitted herein. For example, FIG. 1C may correspond to the R5 region as shown in FIG. 3, and/or FIG. 1D may correspond to the R6 region as shown in FIG. 3.

Referring to FIG. 3, the electronic component 300 includes a circuit board 110, an electronic device 130, and a stiffening structure 120, and a cover 322. The cover 322 is disposed on the stiffening structure 120. The electronic device 130 is disposed in a space S formed by the stiffening structure 120, the cover 322, and the circuit board 110.

In an embodiment, the stiffening structure 120 and the cover 322 form a continuous cap 320.

In an embodiment, the structure of the continuous cap 320 may be similar to the structure of the stiffening structure 120. For example, the continuous cap 320 may include a core base (e.g., the same or similar to the core base 121 as shown in FIG. 1C) and a cladding layer (e.g., the same or similar to the cladding layer 122 as shown in FIG. 1C).

In an embodiment, the conductive terminal (e.g., a solder ball) 140 may be bond on the surface of the circuit board 110 after the continuous cap 320 being disposed.

In the above-mentioned embodiments, during the manufacturing process or the application of the electronic component, the warpage may be reduced, and/or the quality or manufacturing yield of the electronic component may be improved.

In accordance with some embodiments of the disclosure, an electronic component includes a board, an electronic device, and a stiffening structure. The electronic device is disposed on the board. The stiffening structure is disposed on the board. The stiffening structure includes a ring portion corresponding the edge of the board. The stiffening structure includes a core base and a cladding layer. The cladding layer covers the core base.

In accordance with some embodiments of the disclosure, an electronic component includes a board, an electronic device, and a ring structure. The electronic device is disposed on the board. The ring structure is disposed on the board and surrounds the electronic device. A material of the ring structure includes Al—Si alloy.

In accordance with some embodiments of the disclosure, a manufacturing method of an electronic component includes the following steps. A board is provided. A ring structure is disposed on the board. An electronic device is disposed on the board within the ring structure. After disposing the ring structure on the board, the board with the ring structure disposed thereon is heat.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic component, comprising:
    a board;
    an electronic device, disposed on the board; and
    a stiffening structure, disposed on the board, wherein the stiffening structure includes a ring portion corresponding to an edge of the board, and the stiffening structure comprising:
        a core base; and
        a cladding layer, covering the core base, wherein a Young's modulus of the stiffening structure is lower than 20 GPa.

2. The electronic component according to claim 1, wherein a coefficient of thermal expansion of the stiffening structure is about 80% to 120% of a coefficient of thermal expansion of the board.

3. The electronic component according to claim 1, wherein a thermal expansion coefficient of the stiffening structure is about 6 ppm/K to 19 ppm/K.

4. The electronic component according to claim 1, wherein a roughness of an outer surface of the cladding layer is smaller than a roughness of an interface between the cladding layer and the core base.

5. The electronic component according to claim 1, wherein, the Young's modulus of the stiffening structure is about 10 GPa to 19 GPa.

6. The electronic component according to claim 1, wherein in a direction substantially parallel to a surface of the board where the electronic device or the stiffening structure is disposed on, a width of the ring portion of the stiffening structure is at least approximately 5% of a size of the board.

7. The electronic component according to claim 1, wherein in a direction parallel to a surface of board where the electronic device or the stiffening structure is disposed on, a distance between the electronic device and the stiffening structure is larger or approximately equal to 1 mm.

8. The electronic component according to claim 1, wherein a material of the core base comprises Al—Si alloy.

9. The electronic component according to claim 8, wherein a weight ratio of Al and Si in the Al—Si alloy is about 20:80 to 80:20.

10. The electronic component according to claim 8, wherein the cladding layer is a metallic layer.

11. The electronic component according to claim 1, further comprising:
    an adhesive layer, disposed between and in contact with the board and the stiffening structure.

12. The electronic component according to claim 11, wherein the board comprises an organic insulating layer, and the adhesive layer at least contact the organic insulating layer.

13. The electronic component according to claim 1, further comprising:
    a cover, disposed on the stiffening structure, wherein the electronic device is disposed in a space formed by the stiffening structure and the cover.

14. The electronic component according to claim 13, further comprising:
    an adhesive layer, disposed between the stiffening structure and the cover.

15. The electronic component according to claim 13, wherein the stiffening structure and the cover form a continuous cap.

16. The electronic component according to claim 1, there is no molding compound disposed on a surface of the board where the electronic device is disposed on.

17. An electronic component, comprising:
    a board;
    an electronic device, disposed on the board; and
    a ring structure, disposed on the board and surrounding the electronic device, wherein a material of the ring structure comprises Al—Si alloy, wherein a Young's modulus of the ring structure is lower than 20 GPa.

18. The electronic component according to claim 17, wherein a weight ratio of Al and Si in the Al—Si alloy is about 20:80–80:20.

19. The electronic component according to claim 17, wherein in a direction parallel to a surface of the board where the electronic device or the ring structure is disposed on, a width of the ring structure is at least approximately 5% of a size of the board.

20. A manufacturing method of an electronic component, comprising:
    providing a board;
    disposing a stiffening structure on the board wherein the stiffening structure includes a ring structure corresponding to an edge of the board, and the stiffening structure comprising:
        a core base; and
        a cladding layer, covering the core base, wherein a Young's modulus of the stiffening structure is lower than 20 GPa;
    disposing an electronic device on the board within the ring structure; and
    after disposing the ring structure on the board, heating the board with the ring structure disposed thereon.

* * * * *